(12) United States Patent
Xiang et al.

(10) Patent No.: US 7,824,844 B2
(45) Date of Patent: Nov. 2, 2010

(54) SOLVENT MIXTURES FOR ANTIREFLECTIVE COATING COMPOSITIONS FOR PHOTORESISTS

(75) Inventors: Zhong Xiang, Edison, NJ (US);
Hengpeng Wu, Hillsborough, NJ (US);
Hong Zhuang, Raritan, NJ (US);
Eleazar Gonzalez, Bloomfield, NJ (US);
Mark O. Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 263 days.

(21) Appl. No.: 11/624,744

(22) Filed: Jan. 19, 2007

(65) Prior Publication Data

US 2008/0176165 A1  Jul. 24, 2008

(51) Int. Cl.
*G03F 7/40* (2006.01)
*G03F 7/30* (2006.01)
*G03F 7/11* (2006.01)
*C08F 8/30* (2006.01)
*H01L 21/027* (2006.01)

(52) U.S. Cl. .................. 430/325; 430/326; 430/330; 430/271.1; 430/272.1; 430/313; 430/323; 528/259; 525/154; 522/111; 522/164; 522/166

(58) Field of Classification Search .................. None
See application file for complete search history.

(56) References Cited

U.S. PATENT DOCUMENTS

| | | | |
|---|---|---|---|
| 3,474,054 A | 10/1969 | White | |
| 3,775,112 A * | 11/1973 | Alsup et al. | 430/285.1 |
| 4,064,191 A | 12/1977 | Parekh | |
| 4,200,729 A | 4/1980 | Calbo | |
| 4,251,665 A | 2/1981 | Calbo | |
| 4,491,628 A | 1/1985 | Ito et al. | |
| 5,187,019 A | 2/1993 | Calbo et al. | |
| 5,350,660 A | 9/1994 | Urano et al. | |
| 5,597,868 A * | 1/1997 | Kunz | 525/154 |
| 5,843,624 A | 12/1998 | Houlihan et al. | |
| 5,891,959 A | 4/1999 | Kunz | |
| 6,048,934 A * | 4/2000 | Wilt et al. | 525/100 |
| 6,447,980 B1 | 9/2002 | Rahman et al. | |
| 6,723,488 B2 | 4/2004 | Kudo et al. | |
| 6,790,587 B1 | 9/2004 | Feiring et al. | |
| 6,818,250 B2 | 11/2004 | George et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 7,264,913 B2 | 9/2007 | Wu et al. | |
| 2003/0065164 A1 | 4/2003 | Puligadda et al. | |
| 2003/0148213 A1 | 8/2003 | Kaneko et al. | |
| 2004/0072420 A1 | 4/2004 | Enomoto et al. | |
| 2004/0101779 A1 | 5/2004 | Wu et al. | |
| 2005/0266335 A1 | 12/2005 | Johnson et al. | |
| 2006/0058468 A1 | 3/2006 | Wu et al. | |
| 2006/0228646 A1 | 10/2006 | Zampini et al. | |
| 2008/0038659 A1 | 2/2008 | Wu et al. | |

OTHER PUBLICATIONS

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/000118.
Kodama et al., "Synthesis or Novel Fluoropolymer for 157nm Photoresists by Cyclo-polymerization", SPIE vol. 5690, pp. 76-pp. 83, 2002.
U.S. Appl. No. 11/502,706, filed Aug. 10, 2006, Wu et al.
Form PCT/IB/326, Form PCT/IB373, and Form PCT/ISA/237 for PCT/IB2008/000118 dated Jul. 30,2009, which corresponds to U.S. Appl. No. 11/624,744.

* cited by examiner

*Primary Examiner*—Cynthia Hamilton
(74) *Attorney, Agent, or Firm*—Sangya Jain

(57) ABSTRACT

The invention relates to an antireflective coating composition capable of being coated beneath a photoresist layer, where the antireflective coating composition comprises a polymeric crosslinker and a solvent mixture, where the solvent mixture comprises at least one primary organic solvent and at least one secondary organic solvent selected from any of structures 1, 2 and 3,

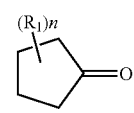 (1)

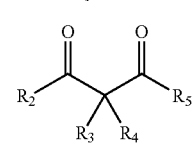

(2)

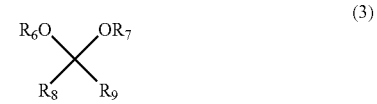

(3)

where, $R_1$, $R_3$, and $R_4$, are selected from H and $C_1$-$C_6$ alkyl, and $R_2$, $R_5$, $R_6$, $R_7$, $R_8$, and $R_9$ are selected from $C_1$-$C_6$ alkyl, and n=1-5. The invention also relates to an antireflective coating composition capable of being coated beneath a photoresist layer, where the antireflective coating composition comprises a polymeric crosslinker and a solvent mixture, where the solvent mixture comprises at least 2 organic solvents, and where the antireflective coating composition has a liquid particle count at 0.2 micron of less than 100/ml after accelerated aging.

17 Claims, No Drawings

SOLVENT MIXTURES FOR ANTIREFLECTIVE COATING COMPOSITIONS FOR PHOTORESISTS

FIELD OF INVENTION

The present invention relates to a novel coating composition comprising solvent mixtures and their use in image processing by forming a thin layer of the novel coating composition between a reflective substrate and a photoresist coating. Such compositions are particularly useful in the fabrication of semiconductor devices by photolithographic techniques.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Additionally, the antireflective coating composition needs to provide a coating which is substantially free of coating defects. Coating defects can arise from different sources, and one such source is from the antireflective coating composition itself. Solvents that prevent insoluble materials from forming in the composition or in the coating are highly desirable, especially where insoluble materials can form during storage and transportation.

The present invention relates to an antireflective coating composition used for photoresist coatings comprising solvent mixtures, where the coating composition is substantially free of defects, especially during storage and transportation.

SUMMARY

An antireflective coating composition capable of being coated beneath a photoresist layer, where the antireflective coating composition comprises a polymeric crosslinker and a solvent mixture, where the solvent mixture comprises at least one primary organic solvent and at least one secondary organic solvent selected from any of structures 1, 2 and 3,

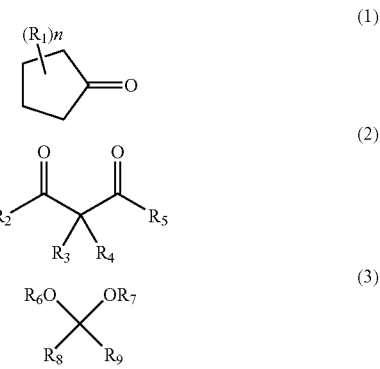

where, $R_1$, $R_3$, and $R_4$, are selected from H and $C_1$-$C_6$ alkyl, and $R_2$, $R_5$, $R_6$, $R_7$, $R_8$, and $R_9$ are selected from $C_1$-$C_6$ alkyl, and n=1-5. The composition may further comprise at least one other polymer. The application also relates to a process of imaging the antireflective coating composition.

An antireflective coating composition capable of being coated beneath a photoresist layer, where the antireflective coating composition comprises a polymeric crosslinker and a solvent mixture, where the solvent mixture comprises at least 2 organic solvents, and where the antireflective coating composition has a liquid particle count at 0.2 micron of less than 100/ml after accelerated aging. The composition may further comprise at least one other polymer. The application also relates to a process of imaging the antireflective coating composition.

DESCRIPTION OF THE INVENTION

The present invention relates to an antireflective coating composition which is coated beneath a photoresist, where the antireflective coating composition comprises a polymeric crosslinker and a novel solvent mixture, where the solvent mixture comprises at least 2 organic solvents. The composition may further comprise at least one other polymer. The solvent mixture enhances the stability of the composition, especially in storage. The composition is substantially free of defects after accelerated aging and/or real time aging. The invention also relates to a process for imaging the photoresist where the antireflective composition is coated beneath the photoresist.

The novel antireflective composition comprises a polymeric crosslinker and a solvent mixture. A second polymer may be added to the composition. It has been found that these novel compositions are substantially free of defects during storage and transportation. Particles may be formed by many different methods and such particles are tested after manufacture of the composition and after an aging process. When the antireflective coating composition is being coated onto the substrate and if particles are present in the solution, these particles will form defects on the substrate. Defects on the substrate can lead to loss of yield in the devices being manufactured and are highly undesirable. Prior to packaging of the coating composition, the solution is filtered to remove particles. Particles may be formed subsequent to packaging at any stage prior to the composition being dispensed onto the substrate. Typically particles may form during storage, transportation, dispensing, and various other stages. The composition may be exposed to different temperatures and different environments prior to use, and these conditions may cause particle formation which can lead to defects in the coating. Various test methods are used to measure the particles or defects in order to insure the quality of the composition. One method for testing defects is a Liquid Particle Counter (LPC), such as Rion KS-41 Particle Counter sold by Rion Company Ltd, Tokyo, Japan. Other devices may be used to measure defects, such as KLA defect inspection tool sold by KLA-Tencor Corp., Milpitas, Calif., USA.

The LPC tool measures defects by counting the size distribution and density of various sized particles in a photoresist solution. The customers desire the number of particles to be under a certain level. As an example, a particle count of less than 100/ml for 0.2 micron size particles may be specified by the customer. In another example a particle count of less than 50/ml for 0.2 micron size particles may be specified by the customer. In yet another example a particle count of less than 30/ml for 0.2 micron size particles may be specified by the customer. Thus, the product must have a particle count below the specified level.

It is desirable to test a product for its long term stability by conducting an accelerated aging test which can show any tendency to form particles in solution. Real time aging studies also show a tendency to form particles, but require a great deal of time. Therefore, an accelerated aging test is often conducted by placing a container of the coating solution in an environment where the temperature has been raised or lowered relative to room temperature and then measuring the particle level at different times. As an example samples may be aged at temperature ranging from 0° C. to 50° C. for 1-200 days. As a specific example the sample may be aged at 5° C. and/or another sample at 40° C. and the defects measured on different days ranging from 2-180 days, or 5-50 days. Any number of days may be specified for the accelerated aging test. If a LPC is used then the number of particles in the composition is measured at different time intervals. Excessive particle formation is undesirable. As an example one sample may be aged at 5° C. and another at 40° C. and the particle count measured at various time intervals for up to 1-10 days, 1-15 days or 1-3 month.

In one embodiment the antireflective coating composition is capable of being coated beneath a photoresist layer, where the antireflective coating composition comprises a polymeric crosslinker and a solvent mixture, where the solvent mixture comprises at least one primary organic solvent and at least one secondary organic solvent, where the secondary organic solvent is selected from any one of structures 1, 2 and 3,

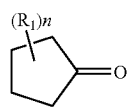

(1)

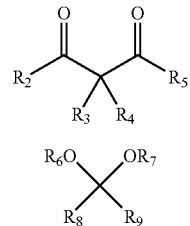

(2)

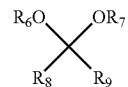

(3)

where, $R_1$, $R_3$, and $R_4$, are selected from H and $C_1$-$C_6$ alkyl, and $R_2$, $R_5$, $R_6$, $R_7$, $R_8$ and $R_9$ are selected from $C_1$-$C_6$ alkyl and n=1-5. At least one other polymer may be added to the composition. The primary organic solvent is capable of dissolving the solid components of the antireflective coating composition. Suitable primary organic solvent for the antireflective coating composition may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate (EEP), ethyl 2-hydroxy-2-methylpropionate, or methylethoxypropionate; a ketal or acetal like 1,3 dioxalane and diethoxymethane; a lactones such as butyrolactone; an amide derivative such as dimethylacetamide or dimethylformamide, anisole, and mixtures thereof. PGME, PGMEA, EEP and EL or mixtures thereof are preferred for the primary organic solvent, and the mixture of PGMEA:PGME may vary from about 60:40 to about 80:20. Solvents with a lower degree of toxicity, good coating and solubility properties are generally preferred. The secondary organic solvent is one which is miscible with the primary organic solvent. Mixtures of the secondary solvent are also useful. The secondary organic solvent may represent up to 25 weight % of the solvent mixture. The secondary organic solvent may represent 1 weight % to 20 weight % of the total solvent mixture. The secondary organic solvent may represent 1 weight % to 10 weight % of the total solvent mixture. Examples of the secondary solvent are cyclopentanone, acetyl acetone(2,4-pentanedione), 2,2' dimethoxypropane and mixtures thereof. The secondary organic solvent may be of structure 1, or structure 2, or structure 3. A mixture of PGMEA, PGME and cyclopentanone may be used. A specific mixture of PGMEA:PGME and 1-10 weight % of cyclopentanone may be used. The antireflective coating composition may have a liquid particle count at 0.2 micron of less than 100/ml after accelerated aging. A particle count at 0.2 micron of less than 50/ml after accelerated aging may be desired. A particle count at 0.2 micron of less than 30/ml after accelerated aging may be desired. The liquid particle count is measured as described herein. The other polymer and polymeric crosslinker are described herein. The composition may additionally contain other additives, such as a thermal acid generator, a photoacid generator, surfactants, striation-free additives, monomeric crosslinking agents, dyes, etc. described herein.

In another embodiment of the present invention, the antireflective coating composition is capable of being coated beneath a photoresist layer, and where the antireflective coating composition comprises a polymeric crosslinker and a solvent mixture, where the solvent mixture comprises at least one primary organic solvent and at least one secondary organic solvent, and where the antireflective coating composition has a liquid particle count at 0.2 micron of less than 100/ml after accelerated aging test. A particle count at 0.2 micron of less than 50/ml after accelerated aging test may be desired. A particle count at 0.2 micron of less than 30/ml after accelerated aging test may be desired. The measurement of liquid particle count during the aging test is measured as described herein. At least one other polymer may be added to the composition. The second other polymer and polymeric crosslinker are also described herein. The solvent mixture comprises a first and a second organic solvent. The second organic solvent is one which is miscible with the first organic solvent and prevents the formation of particles in the liquid composition or defects in the coating. The secondary solvent may be exemplified by any one of those described in structures 1, 2 and 3,

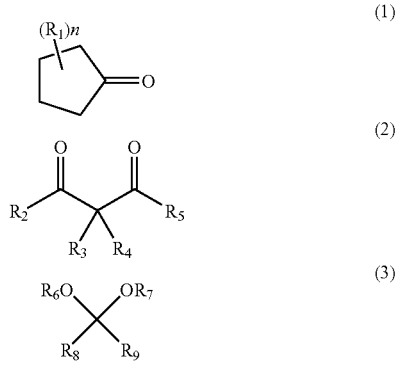

where, $R_1$, $R_3$, and $R_4$, are selected from H and $C_1$-$C_6$ alkyl, and $R_2$, $R_5$, $R_6$, $R_7$, $R_8$, and $R_9$ are selected from $C_1$-$C_6$ alkyl, and n=1-5. The secondary organic solvent may represent up to 25 weight % of the solvent mixture. The second organic solvent may be of structure 1, or structure 2, or structure 3. The second organic solvent may represent 1 weight % to 20 weight % of the solvent mixture. The second solvent may represent 1 weight % to 10 weight % of the solvent mixture. The organic solvent is capable of dissolving all the solid components of the antireflective coating composition. Suitable first organic solvent for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; a ketal or acetal like 1,3 dioxalane and diethoxymethane; an alkoxycarboxylic acid ester such as methyl 3-methoxypropionate, ethyl 3-ethoxypropionate (EEP), ethyl 2-hydroxy-2-methylpropionate, or methyl-ethoxypropionate; a lactones such as butyrolactone; an amide derivative such as dimethylacetamide or dimethylformamide, anisole, and mixtures thereof. PGME, PGMEA, EEP and EL or mixtures thereof are preferred, and the mixture of PGMEA:PGME may vary from about 60:40 to about 80:20. A specific mixture of PGMEA:PGME and 1-10 weight % of cyclopentanone may be used. Solvents with a lower degree of toxicity, good coating and solubility properties are generally preferred. Other additives, such as a thermal acid generator, a photoacid generator, surfactants, striation-free additives, monomeric crosslinking agents, dyes, etc. may be present in the composition as described herein.

In the present specification, unless otherwise stated the terms used are described as follows. Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-, iso, or tert-butyl, linear or branched pentyl, hexyl, heptyl, octyl, decyl, dodecyl, tetradecyl and hexadecyl. Unless otherwise stated, alkyl refers to 1-10 carbon atom moeity. The cyclic alkyl groups may be mono cyclic or polycyclic. Suitable example of monocyclic alkyl groups include substituted cyclopentyl, and cyclohexyl.

The polymeric crosslinker, second polymer and the thermal acid generator used in the present novel antireflective coating composition embodiments are described below.

Polymeric Crosslinker

A polymeric crosslinker is one which is a polymer with crosslinking functionality capable of crosslinking with itself and/or another polymer. Amine-based polymeric crosslinkers may be used, which may be derived from glycolurils, guanamine, melamine, urea-based units, etc. One such crosslinking polymer useful in the present invention may be obtained by reacting at least one glycoluril compound with at least one reactive compound containing at least one hydroxy group and/or one acid group. Any known glycoluril may be used. In one embodiment of the crosslinking polymer the reactive compound which is capable of reacting with the glycoluril comprises 2 or more hydroxy groups (polyhydroxy compound or polyol), or a reactive compound containing 2 or more acid groups (polyacid compound), or a hybrid reactive compound containing both a hydroxy and an acid group. In another embodiment of the crosslinking polymer, the polymer is obtained by reacting at least one glycoluril compound with at least one reactive compound containing one hydroxy group or one acid group. In yet another embodiment the crosslinking polymer is obtained by reacting at least one glycoluril compound with a mixture comprising at least one reactive compound containing at least one hydroxy group or one acid group and at least one reactive compound comprising 2 or more hydroxy groups (polyhydroxy compound or polyol) or a compound containing 2 or more acid groups (polyacid compound), or a hybrid compound containing both a hydroxy and an acid group. The polymer may also contain an aromatic or heteroaromatic chromophore group, which absorbs radiation and therefore can act as an antireflective coating when exposed to imaging radiation. The crosslinking polymer of the present invention may be formed from the condensation reaction of a reactive comonomer containing hydroxy groups and/or acid groups with a glycoluril compound. In the case of one embodiment, at least two reactive groups (hydroxy and/or acid) should be available in the comonomer which reacts with the glycoluril. The polymerization reaction may be catalyzed with an acid. In the case of another embodiment, the glycoluril compound may condense with itself or with another polyol, polyacid or hybrid compound, and additionally, incorporate into the polymer a compound with one hydroxy and/or one acid group. Thus the polymer comprises monomeric units derived from glycoluril and reactive compounds containing a mixture of hydroxy and/or acid groups.

The glycoluril compounds are known and available commercially. Glycolurils are also described in U.S. Pat. No. 4,064,191. Glycolurils are synthesized by reacting two moles of urea with one mole of glyoxal. The glycoluril can then be fully or partially methylolated with formaldehyde. A glycoluril compound containing the moiety of the general description as shown in Structure 4, is useful as one of a possible comonomer for the polymer of the present invention and becomes incorporated into the novel polymer.

Structure 4

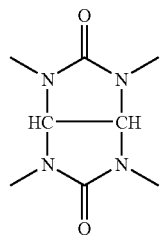

More specifically, the glycouril comonomer can have the Structure 5, where $R_{11}$, $R_{12}$, $R_{13}$, and $R_{14}$ are independently H or ($C_1$-$C_{10}$) alkyl.

Structure 5

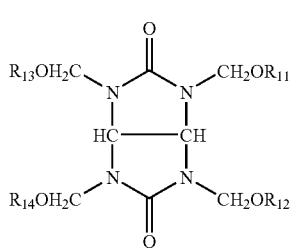

Nonlimiting examples of glycolurils are tetramethylol glycoluril, tetrabutoxymethyl glycoluril, tetramethoxymethyl glycoluril, partially methoylated glycoluril, tetramethoxymethyl glycoluril, dimethoxymethyl glycoluril, mono- and dimethylether of dimethylol glycoluril, trimethylether of tetramethylol glycoluril, tetramethylether of tetramethylol glycoluril, tetrakisethoxymethyl glycoluril, tetrakispropoxymethyl glycoluril, tetrakisbutoxymethyl glycoluril, tetrakisamyloxymethyl glycoluril, tetrakishexoxymethyl glycoluril, and the like. The glycoluril may also be in the form of an oligomer.

The polyhydroxy compound useful as the comonomer for polymerizing with the glycoluril may be a compound containing 2 or more hydroxyl groups or be able to provide 2 or more hydroxyl groups, such as diol, triol, tetrol, glycol, aromatic compounds with 2 or more hydroxyl groups, or polymers with end-capped hydroxyl groups or epoxide groups. More specifically, the polyhydroxy compound may be ethylene glycol, diethylene glycol, propylene glycol, neopentyl glycol, polyethylene glycol, styrene glycol, propylene oxide, ethylene oxide, butylene oxide, hexane diol, butane diol, 1-phenyl-1,2-ethanediol, 2-bromo-2-nitro-1,3-propane diol, 2-methyl-2-nitro-1,3-propanediol, diethylbis(hydroxymethyl)malonate, hydroquinone, and 3,6-dithia-1,8-octanediol. Further examples of aromatic diols are Bisphenol A, 2,6-bis(hydroxymethyl)-p-cresol and 2,2'-(1,2-phenylenedioxy)-diethanol, 1,4-benzenedimethanol, 2-benzyloxy-1,3-propanediol, 3-phenoxy-1,2-propanediol, 2,2'-biphenyldimethanol, 4-hydroxybenzyl alcohol, 1,2-benzenedimethanol, 2,2'-(o-phenylenedioxy)diethanol, 1,7-dihydroxynaphthalene, 1,5-naphthalenediol, 9,10-anthracenediol, 9,10-anthracenedimethanol, 2,7,9-anthracenetriol, other naphthyl diols and other anthracyl diols.

The polyacid compound useful as the reactive comonomer for polymerizing with the glycoluril may be a compound containing 2 or more acid groups or be able to provide 2 or more acidic groups, such as diacid, triacid, tetracid, anhydride, aromatic or aliphatic compounds with 2 or more acid groups, aromatic anhydrides, aromatic or aliphatic dianhydrides, or polymers with end-capped acid or anhydride groups. More specifically, the polyacid compound may be phenylsuccinic acid, benzylmalonic acid, 3-phenylglutaric acid 1,4-phenyldiacetic acid, oxalic acid, malonic acid, succinic acid, pyromellitic dianhydride, 3,3',4,4'-benzophenonetetracarboxylic dianhydride, naphthalene dianhydride, 2,3,6,7-naphthalenetetracarboxylic acid dianhydride and 1,4,5,8-naphthalenetetracarboxylic acid dianhydride, and anthracene diaacid.

Hybrid compounds containing a mixture of hydroxyl and acid groups may also function as comonomers, and may be exemplified by 3-hydroxyphenylacetic acid and 2-(4-hydroxyphenoxy)propionic acid.

The reactive comonomers, in addition to containing a hydroxyl and/or acid group, may also contain a radiation absorbing chromophore, where the chrompophore absorbs radiation in the range of about 450 nm to about 140 nm. In particular for antireflective coatings useful for imaging in the deep uv (250 nm to 140 nm), aromatic moieties are known to provide the desirable absorption characteristics. These chromophores may be aromatic or heteroaromatic moieties, examples of which are a substituted or unsubstituted phenyl group, a substituted or unsubstituted anthracyl group, a substituted or unsubstituted phenanthryl group, a substituted or unsubstituted naphthyl group, a substituted or an unsubstituted heterocyclic aromatic rings containing heteroatoms selected from oxygen, nitrogen, sulfur, and a mixture thereof. Typically, anthracyl moieties are useful for 248 nm exposure, and phenyl moieties are useful for 193 nm exposure. The aromatic groups may have pendant hydroxy and/or acid groups or groups capable of providing hydroxy or acid groups (e.g. epoxide or anhydride) either attached directly to the aromatic moiety or through other groups, where these hydroxy or acid groups provide the reaction site for the polymerization process. As an example, styrene glycol or an anthracene derivative, may be polymerized with a glycoluril of Structure 2.

In certain instances it is important to control the etch resistance and absorptivity of the antireflective coating. In order to provide the desired etch rate of the antireflective coating, especially for imaging below 200 nm, the degree of aromaticity in the polymer may be varied. For high etch rates the aromatic component in the polymer backbone is reduced. It is generally known to those of ordinary skill in the art that aromatics decrease the etch rate. For low etch rates and/or high absorptivity, highly aromatic polymers are desirable. However, in some embodiments, particularly for imaging at wavelengths below 200 nm, optimum performance may be obtained by controlling the etch rate and the absorptivity by using an appropriate mixture of an aliphatic and an aromatic monomer. The aromatic functionality may also be incorporated at other functional points within the polymer. In cases where the absorbing aromatic component is an additive, using the appropriate concentration of that component in the coating solution may give the optimum properties.

The polymer of the present invention is synthesized by polymerizing the comonomers described previously. Typically, the desired glycoluril or mixtures of glycolurils is reacted with the reactive compound comprising polyol, polyacid, hybrid compound with acid and hydroxyl groups, reactive compound with one hydroxy group, reactive compound with one acid group or mixtures thereof, in the presence of a suitable acid. The polymer may be a linear polymer made with a glycoluril with 2 linking sites that are reacted or a network polymer where the glycoluril has more than 2 reactive sites connected to the polymer. Other comonomers may also be added to the reaction mixture and polymerized to give the polymer of the present invention. Strong acids, such as sulfonic acids are preferred as catalyst for the polymerization reaction. A suitable reaction temperature and time is selected to give a polymer with the desired physical properties, such as molecular weight. Typically the reaction temperature may range from about room temperature to about 150° C. and the reaction time may be from 20 minutes to about 24 hours. The weight average molecular weight (Mw) of the polymer is in the range of 1,000 to 50,000, preferably 3,000 to 40,000, and more preferably 3,000 to 35,000, and even more preferably 3,000 to 20,000 for certain applications. Lower molecular weight polymers or oligomers of the polymer may also be used, especially where the molecular weight of the lower molecular weight polymer is about 500 to about 5,000, or about 800 to about 5,000. A low molecular weight polymeric crosslinker may be used with another second polymer or mixture of polymers. Antireflective compositions are described in U.S. 2006/0058468 and incorporated herein by reference.

Polymer

The second polymer of the present invention may be selected from any polymers useful in forming antireflective coatings. Such polymers may be selected from free radical polymers and condensation polymers. The second polymer may be used alone or as a mixture of polymers. Free radical or condensation polymers may be used. Polyesters, polyethers, polysulfones, copolymers of hydroxystryene are examples of useful polymers.

One type of useful polymer has a functional group that is crosslinkable with the polymeric crosslinker. Crosslinkable groups useful for free radical polymerization are exemplified by phenolic groups, hydroxy group attached to a (meth)acrylate monomeric unit, hydroxyl group attached to a vinyl ether monomeric unit, carboxylic acid or amino groups attached to a monomeric unit. Specific units in the polymer may be derived from monomers exemplified by hydroxystyrene, hydroxyethyl methacrylate, hydroxyethyl acrylate, methacrylic acid, acrylic acid, hydroxyethyl vinylether and their equivalents. The polymer may also have a chromophore group, although polymers without a chromophoric group may also be used. Mixtures of polymers with or without chromophoric group may also be used. Aromatic or heteroaromatic polymers function well as chromophoric polymers. Example of chromophores are a substituted or unsubstituted phenyl group, a substituted or unsubstituted anthracyl group, a substituted or unsubstituted phenanthryl group, a substituted or unsubstituted naphthyl group, a substituted or an unsubstituted heterocyclic aromatic rings containing heteroatoms selected from oxygen, nitrogen, sulfur, and a mixture thereof. Examples of chromphoric polymers are ones polymerized with at least one or more of the following monomers: styrene or its derivatives, phenols or its derivatives and an aldehyde, and (meth)acrylates with pendant phenyl, naphthyl or anthracyl groups. More specifically the monomers can be 4-hydroxystyrene, styrene, styrene glycol, cresol and formaldehyde, 1-phenyl-1,2-ethanediol, bisphenol A, 2,6-bis (hydroxymethyl)-p-cresol, ethylene glycol phenyl ether acrylate, 2-(4-benzoyl-3-hydroxyphenoxy)ethyl acrylate, 2-hydroxy-3-phenoxypropyl acrylate, benzyl methacrylate, 2,2'-(1,2-phenylenedioxy)-diethanol, 1,4-benzenedimethanol, naphthyl diols, anthracyl diols, phenylsuccinic acid, benzylmalonic acid, 3-phenylglutaric acid, 1,4-phenyldiacetic acid, pyromellitic dianhydride, 3,3',4,4'-benzophenone-tetracarboxylic dianhydride, naphthalene dianhydride, 2,3,6,7-naphthalenetetracarboxylic acid dianhydride, 1,4,5,8-naphthalenetetracarboxylic acid dianhydride, 9-anthracene methacrylate, and anthracene diacid. The polymers may be homopolymers or copolymers. The chromophoric monomers may be copolymerized with any other comonomer(s) such as $C_1$-$C_{10}$alkyl acrylates, vinylethers, vinylsulfones, etc. Mixtures of crosslinkable polymers may also be used. A crosslinkable polymer and/or a noncrosslinkable polymer may also be used in the composition. The crosslinkable polymer is capable of crosslinking with the polymeric crosslinker.

In certain instances it is important to control the etch resistance and absorptivity of the antireflective coating. In order to provide the desired etch rate of the antireflective coating, especially for imaging below 200 nm, the degree of aromaticity in the polymer may be varied. For high etch rates the aromatic component in the polymer backbone is reduced. It is generally known to those of ordinary skill in the art that aromatics decrease the etch rate. For low etch rates and/or high absorptivity, highly aromatic polymers are desirable. However, in some embodiments, particularly for imaging at wavelengths below 200 nm, optimum performance may be obtained by controlling the etch rate and the absorptivity by using an appropriate mixture of an aliphatic and an aromatic monomer. The aromatic functionality may also be incorporated at other functional points within the polymer. Using the appropriate concentration of the aromatic component in the coating solution may give the optimum properties.

The polymer may comprise at least one aromatic moiety and at least one functional moiety which is acidic. The acidic moiety can be exemplified by phenolic group, carboxylic acid group, other known acidic groups. The polymer may comprise a monomeric group selected from hydroxystyrene, vinyl esters and vinyl ethers. One such polymer may be comprise monomeric units derived from hydroxystyrene and methyl methacrylate. More than one polymer comprising differing monomeric ratios may be used.

A polyester type of polymer may also be used. Such polymers are exemplified by those disclosed in U.S. 2004/0101779 and U.S. Ser. No. 11/502,706 and incorporated herein by reference. A polyester polymer can be formed by the reaction of a dianhydride with diols and glycols. For example pyromellitic dianhydride may be reacted with a glycol and then the free acid groups capped with an organic alcohol or an organic oxide. Also butanetetracarboxylic acid dianhydride may be reacted with styrene glycol followed by reaction with propylene oxide.

Acid Generator

The thermal acid generator can be added to the coating embodiments of the present invention is capable of generating a strong acid upon heating. The thermal acid generator (TAG) used in the present invention may be any that upon heating generates an acid which can react with the crosslinkable polymer of the present invention, particularly preferred is a strong acid such as a sulfonic acid. Preferably, the thermal acid generator is activated at 90° C. and more preferably at above 120° C., and even more preferably at above 150° C. A curing temperature ranging from about 200° C. to 300° C. can also be used. The curing is for a sufficient length of time to harden the film, typically 30 seconds to 10 minutes. Examples of thermal acid generators are metal-free iodonium and sulfonium salts. Examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. Iodonium salts can be exemplified by iodonium fluorosulfonates, iodonium tris(fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl) methide, and iodonium quaternary ammonium bis (fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel compositions of the present invention may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof.

When a mixture of the polymeric crosslinker and another polymer is used, the amount of the polymer in the present composition can vary from about 99 weight % to about 30 weight %, preferably about 85 weight % to about 50 weight % and more preferably about 80 weight % to about 50 weight %, relative to the solid portion of the composition, and the polymeric crosslinker in the present composition can vary from 1 weight % to about 50 weight %, preferably about 5 weight % to about 30 weight % relative to the solid portion of the composition. When the polymeric crosslinker is used as the only polymer, the polymer can vary from about 99.9 weight % to about 80 weight % by total solids. The thermal or photo acid generator, may be incorporated into the composition in a range from about 0.1 to about 10 weight % by total solids of the antireflective coating composition, preferably from 0.3 to 5 weight % by solids, and more preferably 0.5 to 2.5 weight % by solids.

Other components may be added to enhance the performance of the coating, e.g. monomeric dyes, lower alcohols, crosslinking agents, surface leveling agents, adhesion promoters, antifoaming agents, etc.

The film thickness of the antireflective coating can range from about 10 nm to about 450 nm.

The optical characteristics of the antireflective coating are optimized for the exposure wavelength and other desired lithographic characteristics. As an example the absorption parameter (k) of the novel composition for 193 nm exposure ranges from about 0.1 to about 1.0, preferably from about 0.2 to about 0.75, more preferably from about 0.25 to about 0.65. The n and k values can be calculated using an ellipsometer, such as the J. A. Woollam VUV-VASE VU-302™ Ellipsometer. The value of the refractive index (n) ranges from about 1.25 to about 2.2, preferably from about 1.3 to about 2.1, and more preferably from about 1.5 to about 2.1.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 10 nm to about 200 nm. The coating is further heated on a hot plate or convection oven for a sufficient length of time to remove any residual solvent and induce crosslinking, and thus insolubilizing the antireflective coating to prevent intermixing between the antireflective coatings. The preferred range of temperature is from about 90° C. to about 250° C. If the temperature is below 90° C. then insufficient loss of solvent or insufficient amount of crosslinking takes place, and at temperatures above 300° C. the composition may become chemically unstable. A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, silicon, silicon substrate coated with a metal surface, silicon wafer coated with copper, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists, positive and negative, can be any of the types used in the semiconductor industry, provided the photoactive compound in the photoresist and the antireflective coating absorb at the exposure wavelength used for the imaging process. Photoresists used are sensitive to wavelengths below 300 nm. Photoresists sensitive to 248 nm, 193 nm, 157 nm and extreme ultraviolet, and photoresists or analogous materials used in nano imprinting are useful.

To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure below 200 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shunichi Kodama et al Advances in Resist Technology and Processing XIX, Proceedings of SPIE Vol. 4690 p 76 2002; U.S. Pat. No. 6,818,258) or copolymerization of a fluorodiene with an olefin (U.S. 2003/0148213). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various gases are known in the art for etching organic antireflective coatings, such as those comprising $CF_4$, $CF_4/O_2$, $CF_4/CHF_3$, $O_2$ or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VUV-VASE VU-302 ellipsometer. The molecular weight of the polymers was measured on a Gel Permeation Chromatograph. The particles were measured using Rion liquid particle counter available from Rion Ltd., Tokyo, Japan, and the instructions supplied by them.

Polymer Example 1

To a 2-Liter flask equipped with a mechanical stirrer, a heating mantle and a temperature controller were added 400 grams of MX270 (tetramethoxymethyl glycoluril, available from Sanwa Chemicals, Hiratsuka, Japan), 132 grams of neopentyl glycol and 1050 grams of PGMEA. The solution was stirred at 85° C. When the reaction temperature reached 85° C., 6.0 grams of para-toluenesulfonic acid monohydrate was added. The reaction mixture was kept at 85° C. for 6 hours. The heater was turned off and 3.2 grams of triethylamine added. When the reaction mixture cooled down to room temperature, a white gum polymer was isolated. The polymer was transferred to a container and dried under the vacuum to give a white brittle polymer. The polymer product was analyzed by GPC and had a weight average molecular weight ranging from 800 to 10,000, and with a weight average molecular weight of about 5,000 g/mol.

Polymer Example 2

600 grams of tetramethoxymethyl glycoluril, 96 grams of styrene glycol and 1200 grams of propyleneglycolmonomethyl ether acetate (PGMEA) were charged into a 2 liter(l) jacketed flask with a thermometer, mechanical stirrer and a cold water condenser and heated to 85° C. A catalytical amount of para-toluenesulfonic acid monohydrate was added, and the reaction was maintained at this temperature for 5 hrs. The reaction solution was then cooled to room temperature and filtered. The filtrate was slowly poured into distilled water to precipitate the polymer. The polymer was filtered, washed thoroughly with water and dried in a vacuum oven (250 grams of the polymer were obtained). The polymer obtained had a weight average molecular weight of about 17,345 g/mol and a polydispersity of 2.7. $H^1$NMR showed that the polymer was a condensation product of the two starting materials. A broad peak centered at 7. 3 ppm was indicative of the benzene moiety present in the polymer and the broad peak centered at 3.3 ppm was contributed by unreacted methoxy groups ($CH_3O$) on tetramethoxymethyl glycoluril.

Polymer Example 3

400 g of butanetetracarboxylic acid dianhydride, 280 g of styrene glycol, 40 g of benzyltributylammonium chloride, and 1760 g of propyleneglycol monomethyletheracetate (PGMEA) were charged into a 5 L-flask with a condenser, thermal controller and a mechanical stirrer. Under nitrogen and stirring, the mixture was heated to 110° C. After a clear solution was obtained at this temperature, the temperature was reduced to 100° C. and maintained for 4 hrs. Then 1356 g of propylene oxide was added. The reaction was kept at 50° C. for 48 hrs. The reaction solution was cooled to room temperature and slowly poured into large amount of water in a high speed blender. The polymer was collected and washed thoroughly with water. Finally the polymer was dried in a vacuum oven. 720 g of polymer was obtained with a weight average molecular weight (MW) of about 20,000 g/mol.

Formulation Example 1 (Comparative Example)

A comparative formulation was made by dissolving 32 g poly(4-hydroxystyrene-co-methyl methacylate (55:45)), 26 g poly(4-hydroxystyrene-co-methyl methacrylate (30:70)), 23 g polymer from polymer example 1, 0.6 g triethylammonium salts of dodecylsulfonic acid in 4.1 Kg PGMEA/PGME 70:30 mixture.

The solution was filtered using capsule filters and packaged into particle-free 1-liter high density polyethylene (HDPE) bottles. An LPC (liquid particle counter) measurement was done in each bottle of solution by using a Rion KS-41 Particle Counter. The bottles were then sealed and were stored at 5° C., 40° C. and/or room temperature for 7-10 days. They were then placed at room temperature overnight to equilibrate to room temperature before being re-measured by LPC using method described previously. The LPC measurement data is listed in Table 1 below.

TABLE 1

| Container #1 | LPC @ 0.2 µm, #/ml | Container #2 | LPC @ 0.2 µm, #/ml |
|---|---|---|---|
| Initial | 13.1 | Initial | 17.5 |
| After 40° C., 7 days | 24.2 | After 5° C., 10 days | 155.8 |

The data suggested there is particle formation (above 100/ml) for the above formulation after aging at 5° C. after 10 days, and the particle level is relatively stable after aging at 40° C. after 1 week.

Formulation Example 2

A formulation was made by dissolving 32 g poly(4-hydroxystyrene-co-methyl methacrylate (55:45)), 26 g poly(4-hydroxystyrene-co-methyl methacrylate (30:70)), 23 g polymer from polymer example 1, 0.6 g triethylammonium salt of dodecylsulfonic acid in 4.1 Kg PGMEA/PGME 70:30 mixture. Then 123 g cyclopentanone was added into the solution mixture.

The solution was filtered using capsule filters in a closed system and packaged into particle-free 1 liter HDPE bottles. An LPC (liquid particle counter) measurement was done on each bottle of solution using a Rion KS-41 Particle Counter. The bottles were then sealed and were stored at 5° C. and 40° C. for various number of days. After the specified time, they were then placed in room temperature overnight to equilibrate to room temperature before being re-measured for LPC using method described previously. The LPC measurement data is listed in Table 2 below.

TABLE 2

| Container #1 | LPC @ 0.2 µm, #/ml | Container #2 | LPC @ 0.2 µm, #/ml |
|---|---|---|---|
| Initial | 10.5 | Initial | 8.5 |
| After 40° C., 1 week | 20.4 | After 5° C., 10 days | 27.7 |
| After 40° C., 2 weeks | 28.6 | | |

TABLE 2-continued

| Container #3 | LPC @ 0.2 µm, #/ml |
|---|---|
| Initial | 7.8 |
| After 5° C., 1 month | 19.8 |
| 5° C., 3 months | 19.2 |

The data suggested the particle level is relatively stable for above formulation after aging at 5° C. after 3 months and it is acceptably stable after aging at 40° C. after 2 weeks.

Formulation Example 3

A formulation was made by dissolving 32 g poly(4-hydroxystyrene-co-methyl methacylate (55:45)), 26 g poly(4-hydroxystyrene-co-methyl methacrylate (30:70)), 23 g polymer from polymer example 1, 0.6 g triethylammonium salt of dodecylsulfonic acid in 4.1 Kg PGMEA/PGME 70:30 mixture. Then 124 g acetyl acetone was added into the solution mixture.

The solution was filtered using capsule filters in a closed system and packaged into multiple particle-free 100 ml PE bottles. Immediately after packaging, an LPC (liquid particle counter) measurement was done for three bottle of solution using a Rion KS-41 Particle Counter. The remaining bottles were sealed and were stored at 5° C., 40° C. and/or room temperature for 7-10 days. Two bottles stored at each temperature were then placed at room temperature overnight to equilibrate to room temperature before being measured for LPC using method described previously. The lower number of the two LPC measurement data is listed in table below. The data is presented in Table 3.

TABLE 3

| | LPC @ 0.2 µm, #/ml |
|---|---|
| Initial | 14.1 |
| After 5° C., 8 days | 11.1 |
| After Room temperature, 8 days | 32.7 |
| 40° C., 8 days | 66.9 |

The data show that there was some particle formation for the formulation after aging at 40° C. after 8 days. However, the particle level is relatively stable for 5° C. after aging for 8 days.

Formulation Example 4

A formulation was made by dissolving 32 g poly(4-hydroxystyrene-co-methyl methacrylate (55:45)), 26 g poly(4-hydroxystyrene-co-methyl methacrylate (30:70)), 23 g polymer from polymer example 1, 0.6 g triethylammonium salt of dodecylsulfonic acid in 4.1 Kg PGMEA/PGME 70:30 mixture. Then 124 g dimethoxypropane was added into the solution mixture.

The solution was filtered using capsule filters in a closed system and packaged into multiple particle-free 100 ml PE bottles. Immediately after packaging, an LPC (liquid particle counter) measurement was done for three bottles of solution using a Rion KS-41 Particle Counter. The remaining bottles were sealed and were stored at 5° C., 40° C. and/or room temperature for 7-10 days. Two bottles stored at each temperature were then placed at room temperature overnight to equilibrate to room temperature before being measured for LPC using method described previously. The lower number of the two LPC measurement data is listed in Table 4 below.

TABLE 4

|  | LPC @ 0.2 μm, #/ml |
| --- | --- |
| Initial | 5.2 |
| After 5° C., 8 days | 6.2 |
| After Room temperature, 8 days | 6.2 |
| After 40° C., 8 days | 6.7 |

The data suggested the above formulation was stable at 5° C., 40° C. and room temperature after aging for 8 days. There was no particle formation observed.

Formulation Example 5 (Comparative Example)

A comparative formulation was made by dissolving 215 g of polymer from polymer example 2, 107 g polymer from polymer example 3, and 3.2 g triethylammonium salt of dodecylsulfonic acid in 9.2 Kg PGMEA/PGME 70:30 mixture.

The solution was filtered using capsule filters in a closed system and packaged into particle-free 1-liter and 1-gallon HDPE bottles. An LPC (liquid particle counter) measurement was done on each bottle of solution by using a Rion KS-41 Particle Counter. These bottles were then sealed and were stored at 5° C., room temperature (20-25° C.) and/or 40° C. After a specified time, they were then placed at room temperature overnight to equilibrate to room temperature before being re-measured for LPC using method described previously. The LPC measurement data is listed in Table 5 below.

TABLE 5

| Container #1 | LPC @ 0.2 μm, #/ml | Container #2 | LPC @ 0.2 μm, #/ml |
| --- | --- | --- | --- |
| Initial | 13.0 | Initial | 4.5 |
| After 40° C., 7 days | 11.4 | After 5° C., 25 days | 17.1 |
|  |  | After 5° C., 3 months | 56.1 |

The data suggested there is gradual particle formation for above formulation at 5° C. after extended storage. The particle level is relatively stable after aging at 40° C. after 1 week.

Formulation Example 6

A formulation was made by dissolving 147 g of polymer from polymer example 2, 74 g polymer from polymer example 3, 2.7 g triethylammonium salts of dodecylsulfonic acid in 6.1 Kg PGMEA/PGME 70:30 mixture. 188 g cyclopentanone was then added to above mixture.

The solution was filtered using capsule filters in a closed system and packaged into multiple particle-free 100 ml PE bottles. Immediately after packaging, a LPC (liquid particle counter) measurement was done for three bottle of solution using a Rion KS-41 Particle Counter. The remaining bottles were sealed and stored at 5° C., room temperature (20-25° C.) and/or 40° C. for 7-10 days. Two bottles stored at each temperature were then placed at room temperature overnight to equilibrate to room temperature before being measured for LPC using the method described previously. The lower number of the two LPC measurement data is listed in Table 6 below.

TABLE 6

|  | LPC @ 0.2 μm, #/ml Initial | LPC @ 0.2 μm, #/ml 2 weeks | LPC @ 0.2 μm, #/ml 1 month | LPC @ 0.2 μm, #/ml 3 months |
| --- | --- | --- | --- | --- |
|  | 14.3 |  |  |  |
| 5° C. storage |  | 17.6 | 17.8 | 11.5 |
| Room temperature |  | 7.5 | 7.3 | 11.9 |
| 40° C. storage |  | 12.3 | 6.8 | N/A |

The data suggested there was no particle formation for the formulation at 5° C., room temperature and 40° C. after extended storage.

Formulation Example 7

A formulation was made by dissolving 629 g polymer from polymer example 2, 629 g polymer from polymer example 3, 12.6 g triethylammonium salts of dodecylsulfonic acid in 8.3 Kg PGMEA/PGME 70:30 mixture. This was marked as Formulation A. Formulation B was made by taking 6.1 Kg Formulation A and adding 320 g cyclopentanone.

Formulation B and the balance of Formulation A were separately filtered using capsule filters in a closed system and packaged into particle-free liter HDPE bottles. An LPC (liquid particle counter) measurement was done on each bottle of solution by using a Rion KS-41 Particle Counter. These bottles were then sealed and were stored at 5° C. for a specified time. They were then placed at room temperature overnight to equilibrate to room temperature before being re-measured for LPC using method described previously. The PLC measurement data is listed in Table 7 below.

TABLE 7

|  | LPC @ 0.2 μm, #/ml Initial | LPC @ 0.2 μm, #/ml 5° C., 1 week | LPC @ 0.2 μm, #/ml 5° C., 1 month |
| --- | --- | --- | --- |
| Formulation A | 3.3 | 5.8 | 36.4 |
| Formulation B | 3.3 | 5.0 | 19.6 |

The data suggests that Formulation B, which has cyclopentanone showed less particle formation during 1 month storage at 5° C., compared to Formulation A, which was without cyclopentanone as a co-solvent.

The invention claimed is:

1. An antireflective coating composition, where the antireflective coating composition comprises a polymeric crosslinker and a solvent mixture, where the solvent mixture comprises at least one first organic solvent and at least one second organic solvent selected from any of structures 1, 2 and 3,

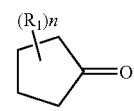

(1)

-continued

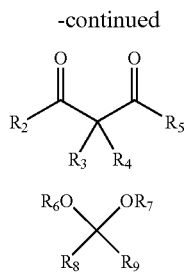

where, $R_1$, $R_3$, and $R_4$, are independently selected from H and $C_1$-$C_6$ alkyl, and $R_2$, $R_5$, $R_6$, $R_7$, $R_8$, and $R_9$ are independently selected from $C_1$-$C_6$ alkyl and n=1-5, further where the polymeric crosslinker is derived from at least one glycoluril monomer and the polymeric crosslinker is soluble in the solvent mixture.

2. The composition according to claim 1, where the concentration of the second organic solvent is less than 25 weight % of the solvent mixture.

3. The composition according to claim 1, where the second organic solvent is in the range of about 1 to 20 weight % of the solvent mixture.

4. The composition according to claim 1, where the second organic solvent is in the range of about 1 to 10 weight % of the solvent mixture.

5. The composition according to claim 1, further comprising an acid generator.

6. The composition according to claim 5, where the acid generator is a thermal acid generator and/or photoacid generator.

7. The composition according to claim 1, where the polymeric crosslinker absorbs radiation.

8. The composition according to claim 1, further comprising a polymer or mixture of polymers.

9. The composition according to claim 8, where the polymer comprises at least one moiety selected from phenolic group, hydroxy group attached to a (meth)acrylate monomeric unit, hydroxyl group attached to a vinyl ether monomeric unit, catoxylic acid or amino groups attached to a monomeric unit and an ester group.

10. The composition according to claim 8, where the polymer is selected from a hydroxystyrene copolymer and a polyester.

11. The composition according to claim 1, further comprising a polymer or mixture of polymers comprising an aromatic group.

12. The composition according to claim 1, where the glycoluril monomer comprises a moiety of structure 4,

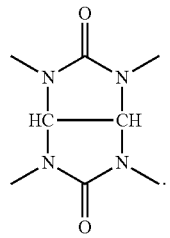

Structure 4

13. The composition according to claim 1, where the polymeric crosslinker is a reaction product of a glycoluril monomer and a compound containing at least one hydroxyl or carboxyl group.

14. The composition according to claim 1, where the first organic solvent comprises at least one solvent selected from propylene glycol monomethyl ether acetate, propylene glycol monomethyl ether, 3-ethoxypropionate, ethyl lactate and mixtures thereof.

15. A process for forming an image comprising,
a) coating and baking a substrate with the coating composition of claim 1;
b) coating and baking a photoresist film on top of the antireflective coating;
c) imagewise exposing the photoresist;
d) developing an image in the photoresist;
e) optionally, baking the substrate after the exposing step.

16. The process of claim 15, where the photoresist is imagewise exposed at wavelengths between 10 nm to 450 nm.

17. The process of claim 15, where the photoresist comprises a polymer and a photoactive compound.

* * * * *